US00RE46937E

(19) United States
(12) Reissued Patent
Jensen et al.

(10) Patent Number: US RE46,937 E
(45) Date of Reissued Patent: Jul. 3, 2018

(54) LASER SYSTEM WITH WAVELENGTH CONVERTER

(71) Applicant: DANMARKS TEKNISKE UNIVERSITET, Lyngby (DK)

(72) Inventors: Ole Bjarlin Jensen, Vaerløse (DK); Peter Eskil Andersen, Tølløse (DK); Paul Michael Petersen, Hillerød (DK)

(73) Assignee: DANMARKS TEKNISKE UNIVERSITET, Lyngby (DK)

(21) Appl. No.: 15/064,420

(22) Filed: Mar. 8, 2016

Related U.S. Patent Documents

Reissue of:
(64) Patent No.: 8,670,474
Issued: Mar. 11, 2014
Appl. No.: 13/819,812
PCT Filed: Sep. 14, 2011
PCT No.: PCT/DK2011/050344
§ 371 (c)(1),
(2) Date: Apr. 15, 2013
PCT Pub. No.: WO2012/034563
PCT Pub. Date: Mar. 22, 2012

U.S. Applications:
(60) Provisional application No. 61/382,609, filed on Sep. 14, 2010.

(30) Foreign Application Priority Data

Mar. 18, 2011 (WO) ..... PCT/DK2011/050091

(51) Int. Cl.
*H01S 3/00* (2006.01)
*H01S 5/068* (2006.01)
(Continued)

(52) U.S. Cl.
CPC ..... *H01S 5/06817* (2013.01); *H01S 5/0092* (2013.01); *H01S 5/062* (2013.01); *H01S 2301/02* (2013.01)

(58) Field of Classification Search
CPC .... H01S 5/062; H01S 5/06817; H01S 5/0092; H01S 2301/02
See application file for complete search history.

(56) References Cited

U.S. PATENT DOCUMENTS 5,128,948 A 7/1992 Papuchon et al.
5,218,609 A 6/1993 Oda
(Continued)

FOREIGN PATENT DOCUMENTS

CN 1591154 3/2005
DE 19732758 2/1999
(Continued)

OTHER PUBLICATIONS

Jedrzejczyk et al; "1 W at 531 nm generated in a ppMgO:LN planar waveguide by means of frequency doubling of a DBR tapered diode laser". Nonlinear Frequency Generation and Conversion: Materials, Devices, and Applications X, Spie, Bellingham WA, USA, vol. 7917, No. 1, Feb. 10, 2011, p. 1-7.
(Continued)

*Primary Examiner* — James Menefee
(74) *Attorney, Agent, or Firm* — Michael Best & Friedrich LLP

(57) ABSTRACT

The present invention relates to an apparatus comprising a diode laser (10) providing radiation in a first wavelength interval, a radiation conversion unit (12) having an input and an output, the radiation converter configured to receive the radiation in the first wavelength interval from the diode laser at the input, the radiation conversion unit configured to convert the radiation in the first wavelength interval to radiation in a second wavelength interval and the output configured to output the converted radiation, the second wavelength interval having one endpoint outside the first wavelength interval. Further, the invention relates to a method of optically pumping a target laser (14) in a laser
(Continued)

system, the laser system comprising a laser source providing radiation at a first frequency, the laser source being optically connected to an input of a frequency converter, the frequency converter configured to convert the radiation at the first frequency to a second, different frequency, the target laser arranged in optical communication with an output of the frequency converter, the method comprising the steps of emitting radiation from the laser source, receiving the radiation at the frequency converter, converting the radiation from the first frequency to the second frequency in the frequency converter, and providing the radiation at the second frequency at the target laser so that the target laser is optically pumped.

42 Claims, 4 Drawing Sheets

(51) Int. Cl.
*H01S 5/00* (2006.01)
*H01S 5/062* (2006.01)

(56) References Cited

U.S. PATENT DOCUMENTS

| | | | | |
|---|---|---|---|---|
| 5,644,584 | A | 7/1997 | Nam | |
| 5,796,902 | A | 8/1998 | Bhat et al. | |
| 6,130,901 | A | 10/2000 | Takamine et al. | |
| 6,287,298 | B1 | 9/2001 | Nighan et al. | |
| 2003/0006382 | A1 | 1/2003 | Spath | |
| 2006/0165137 | A1 | 7/2006 | Kachanov et al. | |
| 2007/0177638 | A1 | 8/2007 | Seelert et al. | |
| 2009/0003402 | A1* | 1/2009 | Nunen et al. | 372/72 |

FOREIGN PATENT DOCUMENTS

| | | | |
|---|---|---|---|
| DE | 19732758 | A1 | 2/1999 |
| EP | 1550905 | | 7/2005 |
| EP | 1550905 | A1 | 7/2005 |
| JP | 2005-70610 | | 3/2005 |

OTHER PUBLICATIONS

Liu et al; "High-power (1.1W) green (532nm) laser source based on single-pass second harmonic generation on a compact micro-optical bench". Nonlinear Frequency Generation and Conversion: Materials, Devices, and Applications X, Spie, Bellingham WA, USA, vol. 7917, No. 1, Feb. 10, 2011, p. 1-7.

Sumpf et al; "1060 nm DBR tapered lasers with 12 W output power and a nearly diffraction limited beam quality". OPtical Sensing II, vol. 7230, Feb. 5, 2009, p. 72301E-1-72301E-8.

Extended European Search Report for Application No. 16182145.9 dated Dec. 19, 2016 (11 pages).

Jensen et al., "High-power green light generation by second harmonic generation of single-frequency tapered diode lasers", Proc. of SPIE, vol. 7582, pp. 758203-1-758203-9 (2010).

Müller et al., "Frequency-doubled DBR-tapered diode laser for direct pumping of Ti:sapphire lasers Generating sub-20 fs Pulses", Optics Express, vol. 19, No. 13, pp. 12156-12163 (2011).

Müller et al., "Frequency-doubled diode laser for direct pumping of Ti:sapphire lasers", Proc. of SPIE, vol. 8235, pp. 82351F1-7 (2012).

First Office Action from the State Intellectual Property Office of China for Application No. 201180043884.3 dated May 11, 2015 (8 pages).

Odriozola et al., "Beam properties of 980nm tapered lasers with separate contacts: Experiments and Simulations" IEEE Journal of Quantum Electronics, vol. 45, pp. 42-50 (2009).*

Odriozola et al., "Beam properties of 980 nm tapered lasers with separate contacts: experiments and simulations", IEEE Journal of Quantum Electronics, vol. 45, pp. 42-50 (2009).

Harb et al., "Intensity-noise dependence of Nd:YAG lasers on their diode-laser pump source", JOSAB, vol. 34, No. 11, pp. 2936-2945 (1997).

Roth et al., "Directly diode-laser-pumped Ti:Sapphire laser", Opt. Lett., vol. 34, No. 21, pp. 3334-3336 (2009).

Kitaoka et al., "Wavelength stabilization of a distributed Bragg reflector laser diode by use of complementary current injection", Opt. Lett., vol. 28, No. 11, pp. 914-916 (2003).

Lundeman et al., "High power 404 nm source based on second harmonic generation in PPKTP of a tapered external feedback diode laser", Optics Express, vol. 16, No. 4, pp. 2486-2493 (2008).

Jensen et al., "1.5 W green light generation by single-pass second harmonic generation of a single-frequence tapered diode laser", Optics Express, vol. 17, No. 8, pp. 6532-6539 (2009).

Liu et al., "Wavelength Matching and Tuning in Green Laser Packaging using Second Harmonic Generation", IEEE, pp. 1064-1069 (2006).

* cited by examiner

LASER SYSTEM WITH WAVELENGTH CONVERTER

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This *application is a reissue of U.S. patent application Ser. No. 13/819,812, now U.S. Pat. No. 8,670,474, which* is the U.S. national stage entry of International Patent Application No. PCT/DK2011/050344, filed on Sep. 14, 2011, which claims priority to U.S. Provisional Patent Application No. 61/382,609, filed on Sep. 14, 2010 and International Patent Application No. PCT/DK2011/050091, filed on Mar. 18, 2011, the contents of all of which are herein fully incorporated by reference.

The present invention relates to applications of frequency converted diode laser systems. In particular the present invention relates to high power tunable, low-noise, frequency converted diode laser systems. The invention further relates to different applications, including but not limited to, such as use of a frequency converted diode laser system for optical pumping of gain medium in solid state laser oscillators and amplifiers, spectroscopy applications and medical applications.

BACKGROUND OF THE INVENTION

Diode lasers output radiation at one frequency or frequency interval, further the diode laser may emit radiation at a further frequency or frequency interval, but that frequency, frequencies or frequency interval may not be the desired frequency interval. Therefore there is a need for providing a system that allow the emitted radiation to be transformed to the desired frequency or frequency interval. The term frequency and wavelength may be interchanged throughout the description using the physical relation between frequency and wavelength.

Related system and method are described in publications such as U.S. Pat. No. 5,644,584 wherein a laser system comprising a distributed Bragg reflector or distributed feedback tunable diode laser coupled to a quasi-phasematched waveguide of optically nonlinear material is disclosed.

In general the output from a laser system may have many uses, e.g. as light source in a measuring system, a system for generating short optical pulses etc. Present systems have several drawbacks, such as high complexity which may result in high maintenance and high cost.

Hence, an improved laser system would be advantageous, and in particular a more efficient laser system which is easily cooled would be advantageous. Further it would be advantageous to provide a laser system having low intensity noise, as this noise type is particularly disadvantageous.

OBJECT OF THE INVENTION

It is an object of the present invention to provide a laser system having low noise properties. Especially it is an object to provide a laser system having low intensity noise properties. It is a further object of the present invention to provide a laser system having a tuneable wavelength. It is still a further object of the present invention to provide an alternative to the prior art.

In particular, it may be seen as an object of the present invention to provide a laser system that solves the above mentioned problems of the prior art.

SUMMARY OF THE INVENTION

Thus, the above described object and several other objects are intended to be obtained in a first aspect of the invention by providing an apparatus comprising a diode laser providing radiation in a first wavelength interval and a radiation conversion unit having an input and an output, wherein the first wavelength interval includes near-infrared radiation, the radiation converter configured to receive the radiation in the first wavelength interval from the diode laser at the input, the radiation conversion unit configured to convert the radiation in the first wavelength interval to radiation in a second wavelength interval and the output configured to output the converted radiation, the second wavelength interval having one end point outside the first wavelength interval, and wherein the noise properties of the diode laser is reduced by actively controlling the injection current.

It is advantageous that the noise properties of the diode laser may be reduced by actively controlling the injection current, e.g. optimizing the intensity noise properties of the laser by actively controlling the supplied current to the diode laser.

Noise may arise from several sources. Intensity noise in a laser system occurs due to variations in the lasers effect, i.e. the amount of light emitted. The amount of light emitted will vary or fluctuate as a function of time. Other types of noise arise as frequency noise or phase noise, where the frequency or phase of the light emitted will vary slightly. Intensity noise mainly occurs due to variations, or noise, in the current supplied to the laser and from mode-hops, i.e. where the laser will hop from emitting light at one frequency to a neighboring frequency. Near these mode-hops the laser will be more unstable and therefor more noisy. One solution is to emit light in a frequency between such two mode-hop frequencies in order to optimize noise properties of the laser system. The noise that will originate from the current may be lowered by filtering the current that is supplied to the laser.

In a laser system having two, or more, separate contacts for controlling the current to different sections of the diode laser independently the following steps may be performed to optimize, i.e. minimize, noise:

- Determine noise in emission, e.g. by using a photodiode,
- Compare noise to threshold value,
- If the noise is above the threshold value, adjusting the current supplied to one of the contact, e.g. a first contact, until the noise is below the threshold value,
- If the noise is above the threshold value and the current supplied to above-mentioned one contact is at a certain lowest current threshold level adjusting the current supplied to the other contact, e.g. the second contact.
- The current supplied to the first contact is at the lowest current threshold level and the current to the second contact is to be adjusted, the current supplied to the first contact may be raised again so that the two currents are within a predetermined range.

The invention is particularly, but not exclusively, advantageous for obtaining a signal having low noise. The invention is further particularly, but not exclusively, advantageous for obtaining a signal having low intensity noise.

A further aspect of the present invention provides a method of optically pumping a target laser in a laser system, the laser system comprising a laser source providing radiation at a first frequency, the laser source being optically connected to an input of a frequency converter, the frequency converter configured to convert the radiation at the first frequency to a second, different frequency, the target laser arranged in optical communication with an output of the frequency converter. The method comprising the steps of emitting radiation from the laser source, receiving the radiation at the frequency converter, converting the radiation from the first frequency to the second frequency in the frequency converter, providing the radiation at the second frequency at the target laser so that the target laser is optically pumped, and wherein the, intensity, noise properties of the diode laser is reduced by actively controlling the injection current.

A still further aspect of the present invention provides a method comprising the steps of providing an apparatus comprising a diode laser providing radiation in a first wavelength interval wherein the first wavelength interval includes near-infrared radiation, and a radiation conversion unit having an input and an output, the radiation converter configured to receive the radiation in the first wavelength interval from the diode laser at the input, the radiation conversion unit configured to convert the radiation in the first wavelength interval to radiation in a second wavelength interval and the output configured to output the converted radiation, the second wavelength interval having one end point outside the first wavelength interval. The method comprising the steps of converting radiation from the diode laser in the radiation converter unit, directing the wavelength converted radiation to a desired area, and reducing the, intensity, noise properties of the diode laser by actively controlling the injection current.

The individual aspects of the present invention may each be combined with any of the other aspects. These and other aspects of the invention will be apparent from the following description with reference to the described embodiments.

BRIEF DESCRIPTION OF THE FIGURES

The systems and methods according to the invention will now be described in more detail with regard to the accompanying figures. The figures show one way of implementing the present invention and is not to be construed as being limiting to other possible embodiments falling within the scope of the attached claim set.

DETAILED DESCRIPTION

Figure 1:
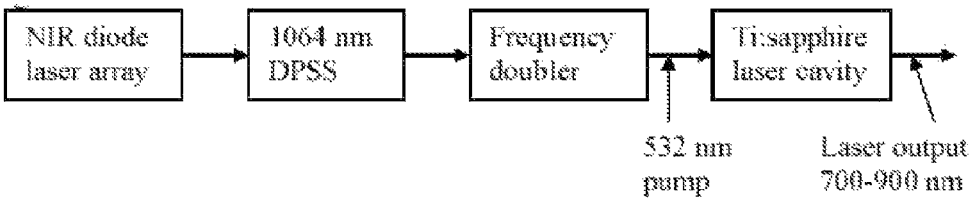
FIG. 1 is a block-diagrammatical illustration of a DPSS laser pumped Ti:sapphire laser.
Figure 3:
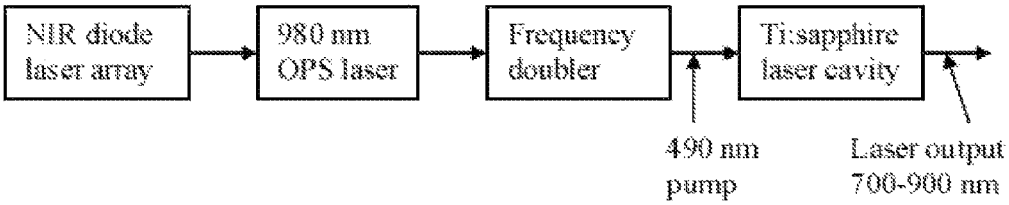
FIG. 3 is a block-diagrammatical illustration of a OPS laser system pumped Ti:sapphire laser.

FIG. 1 is a block-diagrammatical illustration of a DPSS laser pumped Ti:sapphire laser. In system for providing high-power laser light in the ultraviolet and visible spectral region, wavelengths below 700 nm and in particular around 500 nm, diode pumped solid state (DPSS) lasers are the common choice of laser source. These DPSS laser are typically based on the gain media neodymium-doped yttrium iron garnet (Nd:YAG), neodymium-doped yttrium ortho-vanadate (Nd:$YVO_4$), neodymium-doped yttrium lithium fluoride (Nd:YLF) or similar materials doped with either neodymium, ytterbium, thulium, holmium, praseodymium or erbium. These DPSS laser materials provide a wide selection of emission wavelengths in the visible and the near infrared spectral range. The emission wavelengths in the visible spectral range can be used directly, while the near infrared wavelengths need frequency conversion to reach the visible or ultraviolet range. This frequency conversion is typically performed as second harmonic generation (SHG) or sum frequency generation (SFG) or a combination of these. One particularly used is the generation of green light by SHG of a neodymium based laser. The wavelength of the fundamental radiation provided by these gain media is about 1064 nm. Frequency doubling of the fundamental radiation from these gain media results in light at about 532 nm. One laser used for the UV and visible spectral range is the frequency doubled OPS lasers. These lasers are based on the same concept as DPSS lasers. The main difference is the gain material, which in the OPS laser is a semiconductor chip while it is typically a crystal in DPSS lasers. A system including an OPS laser is illustrated in FIG. 3.

High-power, visible, laser sources are used for a wide range of applications including pumping of other laser sources, spectroscopy applications and medical applications.

For the generation of ultrashort laser pulses having a duration of less than about 100 femtoseconds (fs), titanium-doped sapphire, Ti:sapphire, is the laser material of choice. Ti:sapphire has a wide gain bandwidth extending over the spectral range 700-900 nm. The absorption band of Ti:sapphire is also relatively wide with a bandwidth extending over the spectral range 460-600 nm with the absorption peak being at a wavelength of approximately 490 nm.

Frequency doubled DPSS lasers and OPS lasers suitable for pumping Ti:sapphire lasers are, however, not inexpensive and the up to about 50% of the cost of a Ti:sapphire laser may be attributed the pump laser. The dimensions of the frequency doubled DPSS laser are also quite large and comparable to the dimensions of the Ti:sapphire laser being pumped. Usually the frequency doubled DPSS laser and the Ti:sapphire laser are operated as separate units and precise alignment is required. This leads to relatively high complexity of the final laser system. The complexity is further enhanced in a laser system including a Ti:sapphire laser oscillator and a Ti:sapphire laser amplifier. Here two frequency doubled DPSS lasers precisely aligned are required.

For many applications of lasers and ultra-fast laser in particular, low-noise operation is of high importance. In a DPSS laser, such as illustrated in FIG. 1, noise can arise from several places. The diode laser pump source has relaxation oscillation noise and current induced noise. Due to the short recombination time in semiconductors, the relaxation oscillation frequency is high, typically in the GHz range. As the carrier lifetime of typical solid state laser materials is relatively long (10-1000 microseconds) the relaxation oscillation noise from the diode laser has only very little influence on the DPSS laser noise. Current induced noise in the laser diode typically arises from the current supply to the diode laser and is typically in the kHz range. This noise is directly transferred to the DPSS laser output. Furthermore, the DPSS laser exhibit relaxation oscillation noise typically in the tens of kHz range. The noise of the DPSS laser will be transferred to the laser pumped by the DPSS laser. This will increase the signal to noise ratio in measurement applications.

A further limitation of DPSS lasers is the demand for an actively cooled base plate or a re-circulating chiller to remove heat from the laser head. This will add complexity, cost and size of the final laser system.

The relatively high cost and complexity of frequency doubled DPSS lasers for Ti:sapphire laser system pumping is presently limiting the applications of Ti:sapphire lasers to cost-insensitive applications. The availability of smaller and less expensive pump sources is believed to significantly expand the possible applications of the Ti:sapphire laser systems.

In biomedicine, lasers are used for a large number of applications including diagnostics and treatments of many diseases. Especially for many treatments, high power lasers are employed. Application examples of lasers in the visible spectral range could be photo-coagulation of blood vessels in the retina and treatment of vascular lesions. In photo-coagulation of blood vessels in the retina, a laser, which is strongly absorbed by blood, is incident on the targeted blood vessel and the vessel is closed by coagulation of the blood. For this treatment, lasers in the green-yellow spectral range are typically used. For the treatment of different vascular lesions like for instance port wine stains or telangiectasia, a laser is absorbed in the blood vessels in the lesions. The blood is coagulated and the lesion is removed or reduced. Here lasers in the green-yellow spectral range are typically used, as the light is strongly absorbed by the hemoglobin in the blood. Laser sources with sufficient output power and a suitable wavelength for photocoagulation and treatment of vascular lesions are limited to DPSS lasers and OPS lasers. These have the disadvantages of being complex and expensive limiting the use of the treatment methods.

A number of further applications of high power lasers in the UV and visible spectral range exist.

Figure 2:
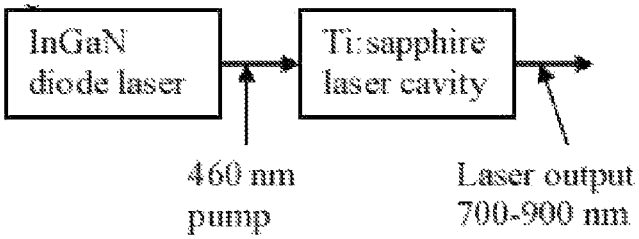
FIG. 2 is a block-diagrammatical illustration of a diode laser pumped Ti:sapphire laser.

The use of semiconductor lasers as pump source for Ti:sapphire lasers, in particular the use of InGaN based diode lasers and optically pumped semiconductor (OPS) lasers is still complex. The use of direct emitting semiconductor lasers as pump source for Ti:sapphire lasers may lead to less complex system compared to DPSS. The use of diode lasers as pump source for Ti:sapphire lasers was demonstrated in Opt. Lett. 34, 3334, 2009. Here a 1 W 452 nm GaN diode laser was used as pump source providing 19 mW of continuous wave Ti:sapphire laser power. A system having an InGaN diode laser pumping a Ti:sapphire laser is illustrated in FIG. 2. Besides the low power efficiency, increased losses resulted from the short pump wavelength. High power diode lasers are typically developed as broad area diode lasers with reduced beam quality in the lateral direction. This reduced beam quality will lower the overlap between the pump beam and the cavity beam of the Ti:sapphire laser and lead to relatively low efficiency. The losses induced from the short wavelength can be omitted by using longer wavelengths in the range 480-600 nm. High power diode lasers are not available in this wavelength range. The use of OPS lasers will lead to high conversion efficiency as the OPS laser wavelength can be tailored the absorption band of Ti:sapphire and the OPS laser has good beam quality. The complexity and price of OPS lasers are, however, similar to that of frequency doubled DPSS lasers and will limit the applications of Ti:sapphire lasers in the same way as frequency doubled DPSS lasers.

The individual elements of an embodiment of the invention may be physically, functionally and logically implemented in any suitable way such as in a single unit, in a plurality of units or as part of separate functional units. The invention may be implemented in a single unit, or be both physically and functionally distributed between different units and processors.

Figure 5:
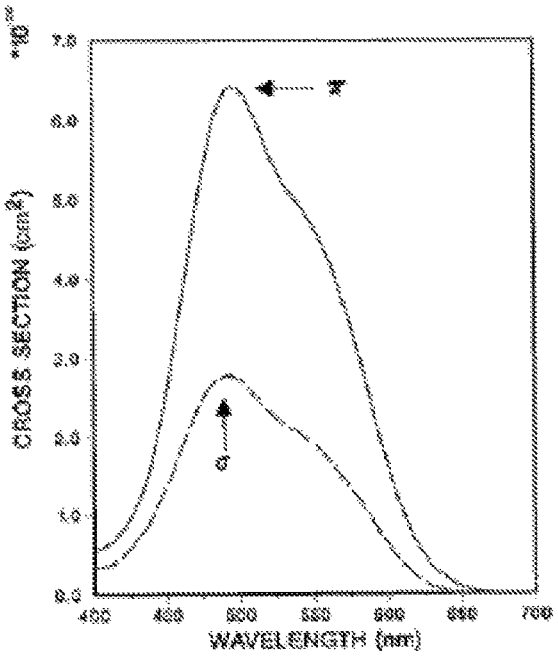
Figure 6:
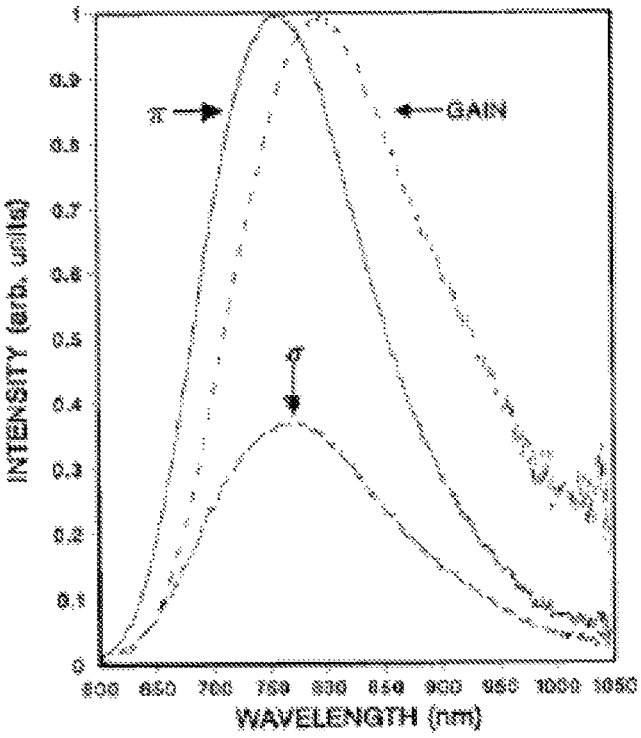

FIG. 5 schematically illustrates polarised absorption cross-section Noise properties of the frequency converted light beam can be optimized compared to the prior art in the following ways. In the prior art noise is generated by the following process. In a DPSS laser, noise can arise from several places. The noise of the diode laser pump source is mainly relaxation oscillation noise and current induced noise. Due to the short recombination time in semiconductors, the relaxation oscillation frequency is high, typically in the GHz range. As the carrier lifetime of typical solid state laser materials is relatively long (typically 10-1000 microseconds) the relaxation oscillation noise from the diode laser has only very little influence on the DPSS laser noise. Current induced noise in the laser diode typically arises from the current supply to the diode laser and is typically in the kHz range. This noise is directly transferred to the DPSS laser output. Furthermore, the DPSS laser exhibit relaxation oscillation noise typically in the tens to hundreds of kHz range. Means to minimize the noise originating both from the pump diode laser and the relaxation oscillations exist but adds complexity and cost to the final laser system. The dependence between diode pump laser noise and the noise of the DPSS laser are well described in C. C. Harb et al. (JOSA B, 14, 11, 2936, 1997). Here it is shown that the DPSS laser crystal clearly adds noise to the laser process. In the system according to the present invention, noise has been found to mainly originate from the diode laser source. Current induced noise may be suppressed by noise filters on the current supply. Relaxation oscillation noise will be present in the laser output. For the applications described here, the relaxation oscillation frequency is much higher than the cut-off frequency of the solid state laser materials to be pumped by the laser system and will thus not influence the final laser system noise performance. Low frequency noise to the final laser system will be caused by low-frequency power fluctuations caused by thermal variations in the laser mount. The cooling system for the laser mount is of high importance for these low-frequency thermal variations. In an ultrafast laser system, e.g. femtosecond Ti:sapphire laser system, variations in the pump power will lead to variations in the obtained spectrum and thus the pulse width. For many applications, it is of paramount importance that the pulse width is constant. Due to the high efficiency of near infrared diode lasers and the highly localized heat source, it is possible to efficiently cool the diode laser in this invention by purely passive means while maintaining the high degree of power stability required from the final laser system. In summary, the overall noise properties of the complete laser system are improved by the present invention, as one noisy component has been eliminated.

Figure 4:
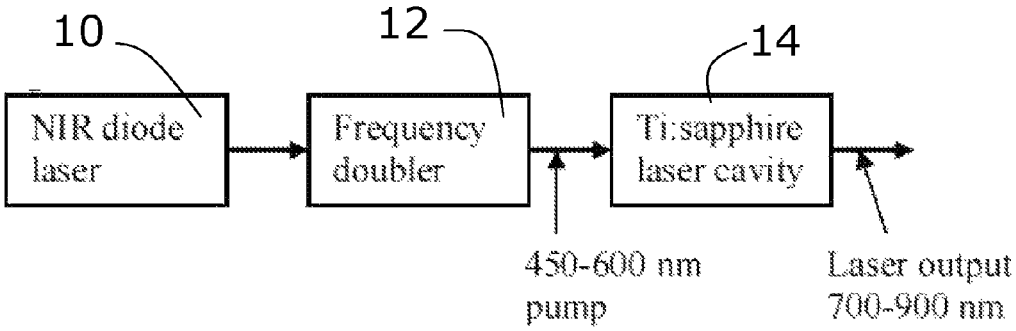
FIG. 4 is a block-diagrammatical illustration of frequency doubled diode laser pumped Ti:sapphire laser, FIGS. 5 and 6 schematically illustrates absorption and emission bands of Ti:sapphire.

FIG. 4 schematically illustrates an apparatus comprising a diode laser 10 providing radiation in a first wavelength interval. The apparatus comprises a radiation conversion unit 12 having an input and an output. The radiation converter unit 12 configured to receive the radiation in the first wavelength interval from the diode laser 10 at the input. The radiation conversion unit 12 configured to convert the radiation in the first wavelength interval to radiation in a second wavelength interval and the output configured to output the converted radiation, the second wavelength interval having one end point outside the first wavelength interval. A small part of the optical signal may be extracted after the frequency converter, e.g. by using an optical splitter, and this optical signal may then be used for monitoring the operation of the system, e.g. determining optical effect, noise properties, and/or as a reference beam or signal.

The output of the converter unit 12 is optically coupled to a laser cavity 14. The laser cavity is preferably a Ti:sapphire laser cavity. In a presently preferred embodiment the first wavelength interval includes near-infrared radiation. The first wavelength interval may depend on the type of laser chosen for the radiation source.

Figure 7:
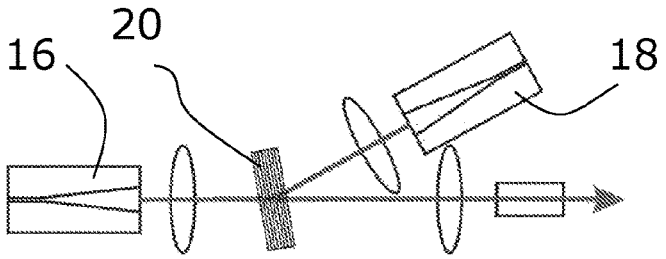
FIG. 7 is a schematic diagram of a laser system providing spectral beam combination.

FIG. 7 schematically illustrates spectral beam combining. In Spectral beam combining (SBC) light at different wavelengths are combined. In FIG. 7 two beams from two lasers, 16 and 18, are combined in an element, 20, it could be a grating, prism or the like. This combination may be performed with a high efficiency, more that 90% efficiency. The result provides two frequencies which allow for sum frequency generation, SFG, which is just as efficient as frequency doubling. Using two lasers having the wavelengths L1 and L2 the resulting SFG beam will have a wavelength being L3=1/(1/L1+1/L2). In principle it is possible to combine more than two beams and still achieve efficient frequency conversion, but this require more from the non-linear crystal.

Figure 8:
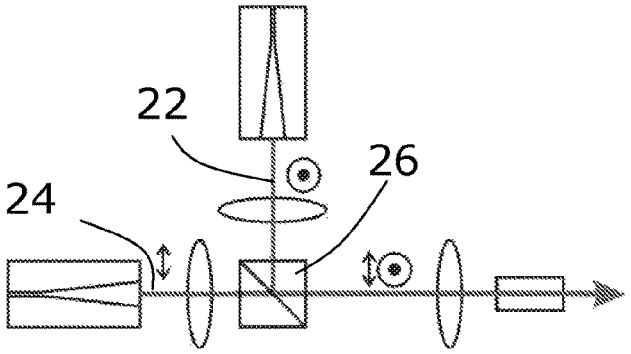
FIG. 8 is a schematic diagram of a laser system combining two polarized laser beams.

FIG. 8 schematically illustrates polarization coupling, where two polarized beams, 22 and 24, are combined. A polarized beam splitter 26 (PBS) is used. The resulting beam will comprise both polarizations. The light may have same or different frequencies, and subsequent frequency doubling or sum frequency generation is possible in order to achieve the desired wavelength. The combination of two beams may be very efficient, >90%, but coupling more than two beams may result in lower efficiency.

In an embodiment the diode laser includes a wavelength-stabilized tapered diode laser.

Advantageously the noise properties of the diode laser may be adjusted by actively controlling the injection current. This allows the noise in the output of the laser system to be adjusted to a desired level. Usually the level should be as low as possible. Controlling the injection current surprisingly allows easy adjustment of the noise level and a relatively low noise level may be achieved.

In an embodiment the diode laser provides radiation in a single-frequency output. Some diode lasers may provide radiation output at multiple frequencies, but single-frequency outputs are preferred.

Actively controlling the injection current provides a multitude of advantageous possibilities, e.g. the beam quality of the diode laser may be optimized by active control of the injection current and/or the spectral line width of the diode laser may be optimized by active control of the injection current.

In an embodiment the wavelength stabilization of the diode laser is performed by using an external cavity. In an embodiment wavelength stabilization of the diode laser may be performed using monolithically integrated structures.

Preferably the diode laser provides an output of more than 1 watt. The diode laser may provide any power level such as 2 watt, 3 watt, 4 watt, 5 watt or any other suitable value.

In an embodiment the diode laser may have two or more electrical contacts for the injection current. This is contemplated to allow easy control of the injection current and ensure safe contact to the diode laser. In an embodiment the active control of the injection current is performed using two separate contacts for controlling the current to different sections of the diode laser independently. If more than two contacts are present the active control of the injection current may be performed using only two of the separate contacts to operate the laser in a regime where the intensity noise is optimal.

The radiation conversion unit may be constructed in several ways; in one embodiment the radiation conversion unit includes a non-linear optical material. The non-linear optical material is contemplated to allow a conversion of the wavelength or frequency of the signal, either up or down conversion. The conversion may be a frequency doubling, but other factors may be implemented, such as frequency conversion by 0.5, 2.0, 2.5 or the like. Preferably any other conversion than frequency doubling is performed using sum or difference generating.

In specific embodiments the non-linear optical material may be a periodically poled crystal and/or a birefringent crystal and/or a waveguide and/or a photonic crystal and/or non-linear fibre or any combinations thereof.

In an embodiment the radiation conversion unit includes an external resonant cavity wherein the non-linear material is positioned.

In an advantageous embodiment the system comprises a passive cooling system configured to cool the diode laser. This is surprisingly enough inmost configurations to cool the laser. In most other laser systems, active cooling is required. The use of passive cooling is less complex and usually more reliable than active cooling. Further active cooling requires power and complex components that are more expensive.

Figure 9:
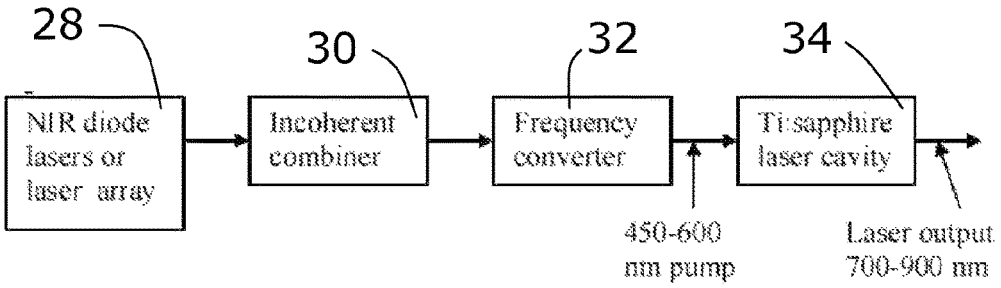
FIG. 9 is a schematic block illustration of a frequency converted incoherently combined diode laser pumped Ti:sapphire laser system.

In an embodiment the laser system comprises two diode lasers arranged as to output two polarized output beams. Specifically the two polarized output beams may be of different polarizations. More preferably the apparatus outputs a beam being a combination of two polarized output beams. In an embodiment the two polarized output beams have different wavelengths. This may be used in embodiments wherein the two polarized output beams are combined coherently or incoherently. In an embodiment the laser system comprises more than two diode lasers, e.g. three, four, five, or more diode laser. FIG. 9 schematically illustrates a system where the optical signal from two or more diode laser sources 28, arranged either as individual diode lasers or an array of lasers, are combined incoherently 30. The combined signal is frequency converted at 32, before it is used for pumping the Ti:sapphire laser cavity 34. A small part of the optical signal may be extracted after the frequency converter, e.g. by using an optical splitter, and this optical signal may then be used for monitoring the operation of the system, e.g. determining optical effect, noise properties, and/or as a reference beam or signal.

Figure 10:
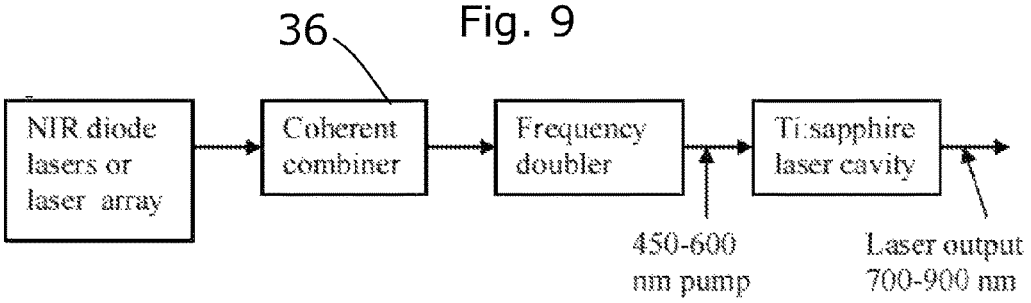
FIG. 10 is a schematic block diagram of a Frequency doubled coherently combined diode laser pumped Ti:sapphire laser system.

FIG. 10 illustrates a system similar to that of FIG. 9, but here a coherent combiner 36 is used and the frequency converter is a frequency doubler. As with the system of FIG. 9 a small part of the optical signal may be extracted after the frequency converter, e.g. by using an optical splitter, and this optical signal may then be used for monitoring the operation of the system, e.g. determining optical effect, noise properties, and/or as a reference beam or signal.

As mentioned elsewhere in an embodiment the radiation conversion unit doubles the frequency of the radiation from the diode laser.

In an embodiment the radiation conversion unit generates radiation by sum frequency mixing of the radiation in the first spectral region. This may also be useful when combining two or more beams.

The radiation conversion unit may generate radiation by difference frequency mixing of the radiation in the first spectral region.

In an embodiment the system may further comprise a modulator unit configured to modulate the radiation from the diode laser. This surprisingly allows enhanced modulation of the light or radiation emitted by the system. This is not possible when employing solid state lasers.

In an embodiment the diode laser is modulated directly by injecting modulation current to the diode laser. This is surprisingly advantageous as it still allow obtaining low noise properties of the laser system.

In an embodiment the diode laser is a broad-area diode laser and/or a single-mode diode laser. The choice of diode laser may depend on the choice of converter unit and desired wavelength.

In an embodiment the diode laser is constituted by an array of diode lasers. This may allow raising the power output from the system by combining output of several diode lasers. Further the individual diode lasers may have different wavelength outputs, alternatively the individual diode lasers may have similar or identical wavelength outputs.

In an embodiment the laser system may further comprise a wavelength selection device. This may allow selecting a wavelength from the emitted radiation. In an embodiment the wavelength selection device is an optical band-pass filter, an optical low-pass filter, an optical high-pass filter, a diffraction grating, a volume Bragg grating, a fiber Bragg grating, a prism or an interference filter, or any combination thereof.

In an embodiment the output is coupled to an optical fibre. The optical fibre may be used for guiding the emitted radiation to a desired area, as described elsewhere in this description.

In an embodiment the second wavelength interval is 300 nm to 600 nm, such as 330 nm to 550 nm, such as 400 nm to 450 nm, such as 300 nm to 330 nm, such as 330 nm to 400 nm, such as 400 nm to 450 nm, such as 450 nm to 500 nm, such as 500 nm to 550 nm, such as 550 nm to 600 nm.

In an embodiment the second wavelength interval is 1500 nm to 6000 nm, such as 1500 nm to 2000 nm, such as 2000 nm to 2500 nm, such 2500 nm to 3000 nm, such as 3000 nm to 3500 nm, such as 3500 nm to 4000 nm, such as 4000 nm to 4500 nm, such as 4500 nm to 5000 nm, such as 5000 to 5500 nm, such as 5500 nm to 6000 nm, such as 1700 nm to 5700 n, such as 2000 nm to 5000 nm, such as 3000 nm to 4000 nm.

In an embodiment the system comprises a laser configured to receive radiation at the second wavelength interval. This may be advantageous as the second wavelength interval may be at the absorption band of the laser.

In an embodiment the laser includes a Ti:sapphire laser and the second wavelength interval includes the peak absorption of Ti:sapphire. This is advantageous as the Ti:sapphire laser may be optically pumped to generate ultra short pulses, as described elsewhere in the present description.

Figure 13:
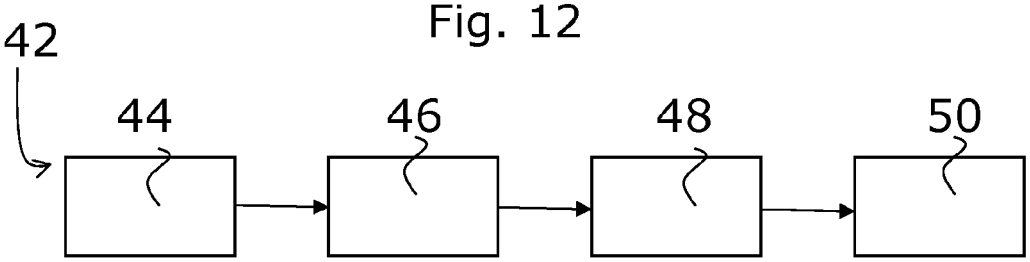
FIG. 13 is a schematic illustration of steps of a first method.

FIG. 13 is a schematic block diagram illustrating steps of a method 42 of optically pumping a target laser in a laser system, the laser system comprising a laser source providing radiation at a first frequency, the laser source being optically connected to an input of a frequency converter, the frequency converter configured to convert the radiation at the first frequency to a second, different frequency, the target laser arranged in optical communication with an output of the frequency converter, the method comprising the steps of emitting 44 radiation from the laser source, receiving 46 the radiation at the frequency converter, converting 48 the radiation from the first frequency to the second frequency in the frequency converter, providing 50 the radiation at the second frequency at the target laser so that the target laser is optically pumped.

The method may further include the second frequency being within the absorption band of the target laser. This is advantageous in that as much radiation as possible may be absorbed in the target laser. The second frequency may overlap less than 100% with the absorption band of the target laser. In an embodiment the target laser is a Ti:sapphire laser.

Figure 14:
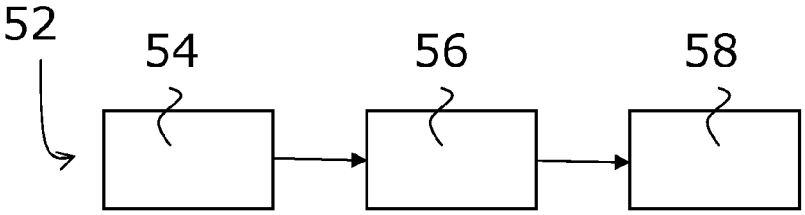
FIG. 14 is a schematic illustration of steps of a second method.

FIG. 14 schematically illustrates the steps of a method 52 comprising the steps of providing an apparatus 54 comprising a diode laser providing radiation in a first wavelength interval, and a radiation conversion unit having an input and an output, the radiation converter configured to receive the radiation in the first wavelength interval from the diode laser at the input, the radiation conversion unit configured to convert the radiation in the first wavelength interval to radiation in a second wavelength interval and the output configured to output the converted radiation, the second wavelength interval having one end point outside the first wavelength interval, converting 56 radiation from the diode laser in the radiation converter unit, and directing 58 the wavelength converted radiation to a desired area.

Figure 11:
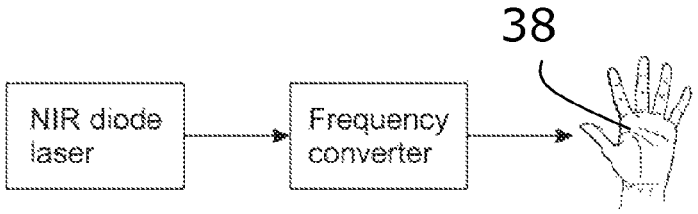
FIG. 11 is a schematic block diagram illustration of use of a laser system for treatment.

In an embodiment the desired area is on a person or animal. For instance the desired area may be at a skin-region of a person or animal. In FIG. 11 this is illustrated as the hand 38 of a person. In FIG. 11 the system has been simplified to illustrate only a NIR diode laser source and a frequency converter. For therapeutic purposes it has been found that light in the yellow spectral region and/or green spectral region are especially advantageous. In the embodiment in FIG. 11 a small part of the optical signal may be extracted after the frequency converter, e.g. by using an optical splitter, and this optical signal may then be used for monitoring the operation of the system, e.g. determining optical effect, noise properties, and/or as a reference beam or signal.

In an embodiment the apparatus is used for treating vascular diseases and/or eye diseases.

In an embodiment the apparatus is used for fluorescence diagnostics. This may be an advantageous use as the noise properties of the laser system are very suitable for performing fluorescence diagnostics.

Figure 12:
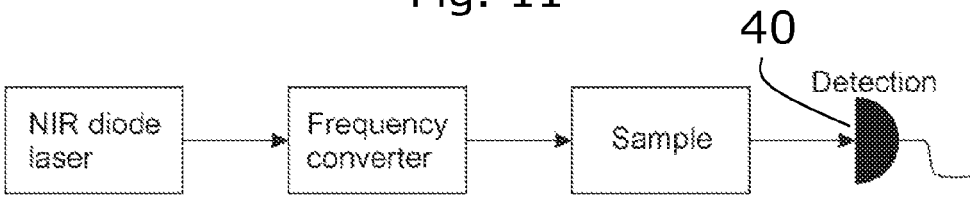
FIG. 12 is a schematic block diagram illustration of use of a laser system for measuring purpose.

In an embodiment the apparatus is used for spectroscopy. When performing spectroscopy it is of great advantage that the signal comprises a low amount of noise. FIG. 12 schematically illustrates an embodiment where the signal from a NIR diode laser source is frequency converted before traveling through a sample and being detected at the detector. In the embodiment in FIG. 12 a small part of the optical signal may be extracted after the frequency converter, e.g. by using an optical splitter, and this optical signal may then be used for monitoring the operation of the system, e.g. determining optical effect, noise properties, and/or as a reference beam or signal.

In an embodiment the apparatus emits light in the blue and/or ultraviolet spectral region. This may be especially useful for special applications, such as the applications mention throughout this description.

In an embodiment the apparatus is used for flow cytometry. This is an advantageous application as the low noise in the optical signal provides an improved detection in the measuring system.

Although the present invention has been described in connection with the specified embodiments, it should not be construed as being in any way limited to the presented examples. The scope of the present invention is to be interpreted in the light of the accompanying claim set. In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. A method for reducing intensity noise of a laser apparatus, the apparatus comprising:

a wavelength-stabilized tapered diode laser providing radiation in a first wavelength interval, the diode laser comprising two separate contacts for controlling injection currents to different sections of the diode laser independently;

a radiation conversion unit having an input and an output, the radiation conversion unit being configured to receive the radiation in the first wavelength interval from the diode laser at the input and to convert the radiation in the first wavelength interval to radiation in a second wavelength interval, and the output being configured to output the converted radiation, the second wavelength interval having one end point outside the first wavelength interval, wherein the method comprises actively controlling an injection current to the diode laser so as to reduce the intensity noise properties of the [diode] laser *apparatus* by performing the following steps:

determining intensity noise in the [emitted] *converted* radiation, comparing the determined noise to a threshold value,

[if the determined] *in response to determining the* noise is above the threshold value, adjusting the injection current supplied to a first one of the contacts until the noise is below the threshold value, *and*

[if the determined] *in response to determining the* noise is above the threshold value and the injection current supplied to the first contact is at a lowest current threshold level, adjusting the injection current supplied to the second contact.

2. The method according to claim 1, further comprising optimizing the beam quality of the diode laser by active control of the injection current.

3. The method according to claim 1, further comprising optimizing the spectral line width of the diode laser by active control of the injection current.

4. The method according to claim 1, wherein adjusting the injection current supplied to the second contact further comprises, raising the injection current supplied to the first contact so that the two injection currents are within a predetermined range.

5. The method according to claim 1, wherein the diode laser provides radiation in a single-frequency output.

6. The method according to claim 1, wherein the wavelength stabilization of the diode laser is achieved using an external cavity.

7. The method according to claim 1, wherein the wavelength stabilization of the diode laser is achieved by using monolithically integrated structures.

8. The method according to claim 7, wherein at least one of the monolithically integrated structures is a grating.

9. The method according to claim 1, wherein the diode laser provides an output of more than 1 watt.

10. The method according to claim 1, wherein the radiation conversion unit includes a non-linear optical material.

11. The method according to claim 10, wherein the non-linear optical material is a periodically poled crystal and/or a birefringent crystal and/or a waveguide and/or a photonic crystal and/or non-linear fibre or any combinations thereof.

12. The method according to claim 10, wherein the radiation conversion unit includes an external resonant cavity wherein the non-linear material is positioned.

13. The method according to claim 1, wherein the apparatus further comprises a passive cooling system configured to cool the diode laser.

14. The method according to claim 1, wherein the apparatus [further] comprises two diode lasers outputting two polarized output beams.

15. The method according to claim 14, wherein the two polarized output beams have different polarizations.

16. The method according to claim 14, wherein the apparatus outputs a beam being a combination of two polarized output beams.

17. The method according to claim 14, wherein the two polarized output beams have different wavelengths.

18. The [apparatus] method according to claim 14, wherein the two polarized output beams are combined coherently or incoherently.

19. The method according to claim 1, wherein the radiation conversion unit doubles the frequency of the radiation from the diode laser.

20. The method according to claim 1, wherein the radiation conversion unit generates radiation by sum frequency mixing of the radiation in the first spectral region.

21. The method according to claim 1, wherein the radiation conversion unit generates radiation by second harmonic generation and/or difference frequency mixing and/or sum frequency mixing of the radiation in the first spectral region.

22. The method according to claim 1, wherein the apparatus further comprises a modulator unit configured to modulate the radiation from the diode laser [and wherein the diode laser is modulated directly by injecting modulation current to the diode laser].

23. The method according to claim 22, wherein the diode laser is modulated directly by injecting modulation current to the diode laser.

24. The method according to claim 1, wherein the diode laser is a broad-area diode laser and/or a single-mode diode laser.

25. The method according to claim 1, wherein the diode laser is constituted by an array of diode lasers.

26. The method according to claim 1, further comprising a wavelength selection device.

27. The method according to claim 26, wherein the wavelength selection device is an optical band-pass filter, an optical low-pass filter, an optical high-pass filter, a diffraction grating, a volume Bragg grating, a fiber Bragg grating, a prism or an interference filter, or any combination thereof.

28. The method according to claim 1, wherein the output is coupled to an optical fibre.

29. The method according to claim 1, wherein the second wavelength interval is 330 nm to 600 nm.

30. The method according to claim 1, wherein the second wavelength interval is 1500 nm to 6000 nm.

31. The method according to claim 1, wherein the apparatus further comprises a laser configured to receive radiation at the second wavelength interval.

32. The method according to claim 31, wherein the laser includes a Ti:sapphire laser and the second wavelength interval includes the peak absorption of Ti:sapphire.

33. A method of optically pumping a Ti:sapphire laser in a laser system, the laser system comprising a tapered diode laser source providing radiation at a first frequency, the diode laser comprising two separate contacts for controlling injection currents to different sections of the diode laser independently, the diode laser source being optically connected to an input of a frequency converter, the frequency converter being configured to convert the radiation at the first frequency to a second, different frequency within an absorption band of the Ti:sapphire laser, the Ti:sapphire laser being arranged in optical communication with an output of the frequency converter, the method comprising the steps of:

emitting radiation from the diode laser source, receiving the radiation at the frequency converter, converting the radiation from the first frequency to the second frequency in the frequency converter, providing the radiation at the second frequency at the target laser so that the target laser is optically pumped, and wherein the method further comprises actively controlling the injection currents of the diode laser so as to reduce intensity noise properties of the [diode] laser *system* by performing the steps of:

determining intensity noise in the [emitted] *converted* radiation, comparing the determined noise to a threshold value,

[if the determined] *in response to determining* noise is above the threshold value, adjusting the injection current supplied to a first one of the contacts until the noise is below the threshold value, *and*

[if the determined] *in response to determining the* noise is above the threshold value [and] *or* the injection current supplied to the first contact is at a lowest current threshold level, adjusting the injection current supplied to the second contact.

34. The method according to claim 1, further comprising [directing] *positioning the apparatus to direct* the [wavelength] converted radiation to a desired area and/or volume.

35. The method according to claim [34] *1*, [wherein the desired area is at] *further comprising positioning the apparatus to direct the converted radiation to* a skin-region of a person or animal.

36. The method according to claim 35, wherein the apparatus [provides] *is configured to provide* light in the yellow [spectal] *spectral* region and/or green spectral region.

37. The method according to claim 34, wherein the apparatus is [used] *configured* for treating vascular diseases and/or eye diseases.

38. The method according to claim 34, wherein the apparatus is [used] *configured* for fluorescence diagnostics.

39. The method according to claim 34, wherein the apparatus is [used] *configured* for spectroscopy.

40. The method according to claim 39, wherein the apparatus [emits] *is configured to emit* light in the blue and/or ultraviolet spectral region.

41. The method according to claim 34, wherein the apparatus is [used] *configured* for flow cytometry.

42. The method according to claim [34] *1*, [wherein the] *further comprising positioning the apparatus to direct the converted radiation to a* desired area [is] on a person or animal.

* * * * *